United States Patent [19]

Suzuki et al.

[11] Patent Number: 5,675,482

[45] Date of Patent: Oct. 7, 1997

[54] ACCIDENT DETECTION CIRCUIT OF A VOLTAGE-TYPE SELF-EXCITED POWER CONVERTER

[75] Inventors: Kenichi Suzuki, Sagamihara; Noriko Kawakami, Fuchu; Haruhisa Inokuchi, Kunitachi, all of Japan

[73] Assignees: The Tokyo Electric Power Company, Incorporated, Tokyo; Kabushiki Kaisha Toshiba, Kawasaki, both of Japan

[21] Appl. No.: 600,922

[22] PCT Filed: Jun. 27, 1995

[86] PCT No.: PCT/JP95/01278

§ 371 Date: Feb. 27, 1996

§ 102(e) Date: Feb. 27, 1996

[87] PCT Pub. No.: WO96/00463

PCT Pub. Date: Jan. 4, 1996

[30] Foreign Application Priority Data

Jun. 27, 1994 [JP] Japan .................. 6-144366

[51] Int. Cl.⁶ .................. H02H 7/122; H02H 3/26; H02M 7/521
[52] U.S. Cl. .................. 363/58; 363/136; 361/84
[58] Field of Search .................. 363/27, 58, 136; 361/82, 84

[56] References Cited

U.S. PATENT DOCUMENTS

| 4,546,422 | 10/1985 | Okado .................. 363/56 |
| 4,651,270 | 3/1987 | Edwards .................. 363/57 |
| 5,177,428 | 1/1993 | Hirose et al. .................. 363/58 |
| 5,204,563 | 4/1993 | Jason .................. 363/58 |
| 5,436,819 | 7/1995 | Mikami et al. .................. 363/58 |

FOREIGN PATENT DOCUMENTS

| 53-29008 | 8/1978 | Japan . |
| 5-19390 | 3/1993 | Japan . |
| 59-32366 | 2/1984 | WIPO . |

*Primary Examiner*—Peter S. Wong
*Assistant Examiner*—Bao Q. Vu
*Attorney, Agent, or Firm*—Oblon, Spivak, McClelland, Maier & Neustadt, P.C.

[57] ABSTRACT

The accident detection circuit of the present invention is such that in a voltage-type self-excited power converter composed of anode reactors 13 and 23 connected in series, respectively, to power semiconductor elements 11 and 21 of self turn off type connected in series, there are provided anode reactor voltage direction-detecting circuits 16 and 26 which detect, respectively, that the voltage in the direction generated in the anode reactors 13 and 23 exceeds a predetermined value when the current flowing in the direction of from the anode to the cathode of the each element 11, 21 increases, anode current direction-detecting circuits 17 and 27 which detect, respectively, that the current flows in the direction of from the anode to the cathode of the each element 11, 21, delay circuits 18 and 28 which delay, respectively, the output signal of each arm current direction-detecting circuit by a certain period of time, and AND circuits 19 and 29 which designate the output signal of the each anode reactor voltage direction-detecting circuit 16, 26 and the output signal of the each delay circuit 18, 28, respectively, as the input signal, and the output signal of each AND circuit 19, 29 is designated as the accident detection signal of the converter.

15 Claims, 6 Drawing Sheets

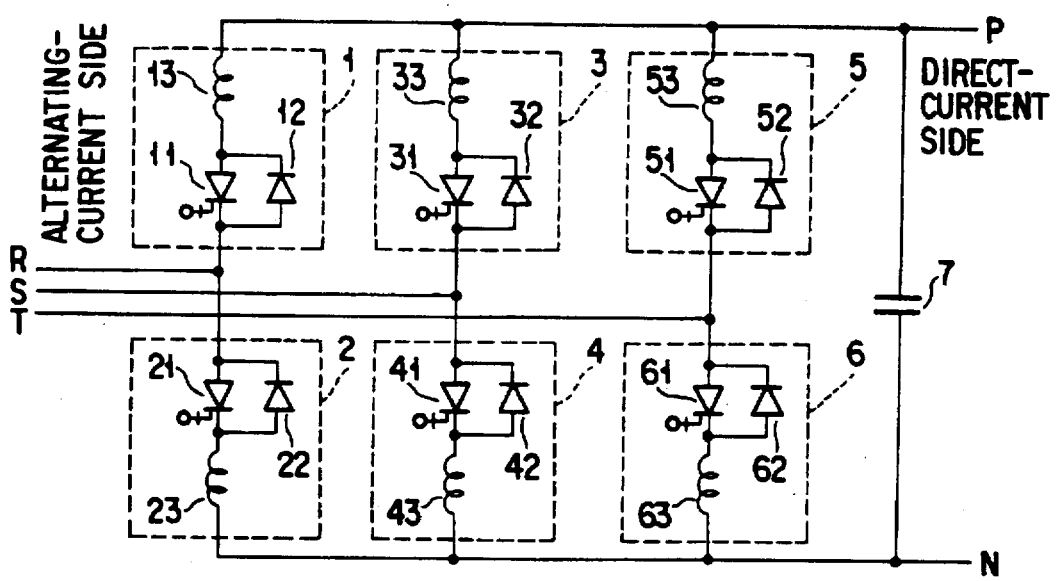
F I G. 1
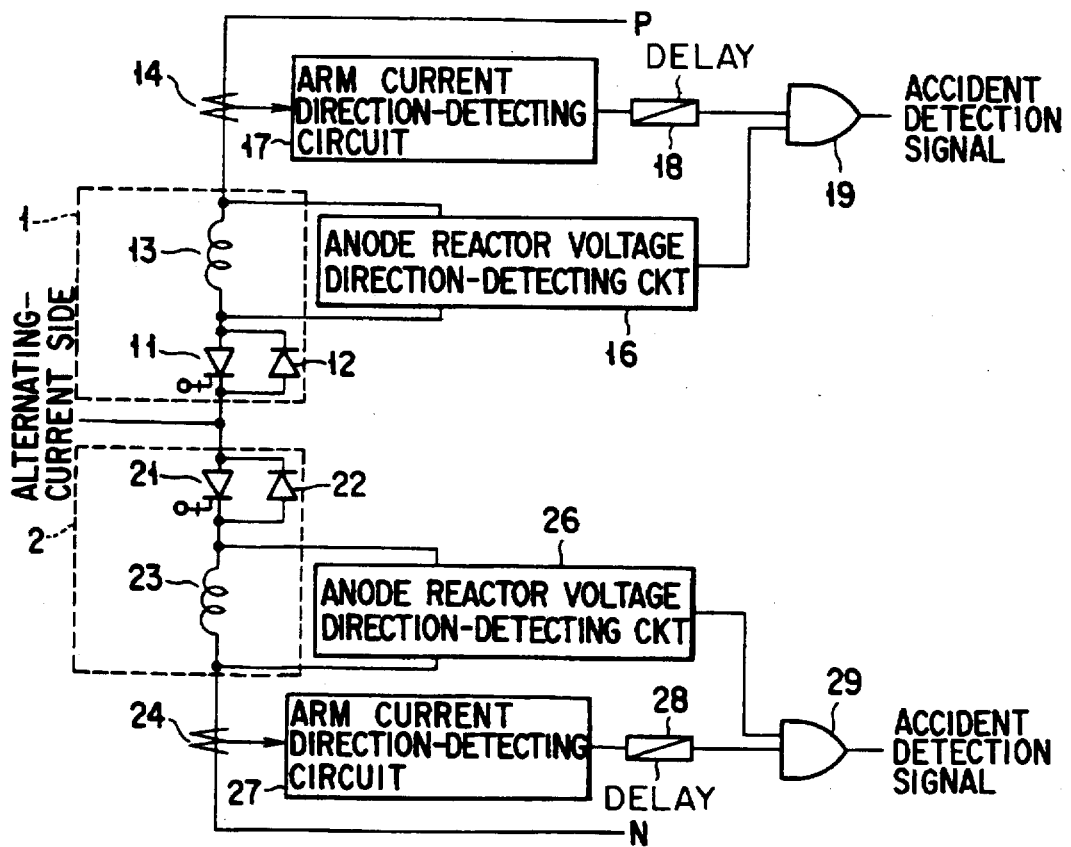
F I G. 2

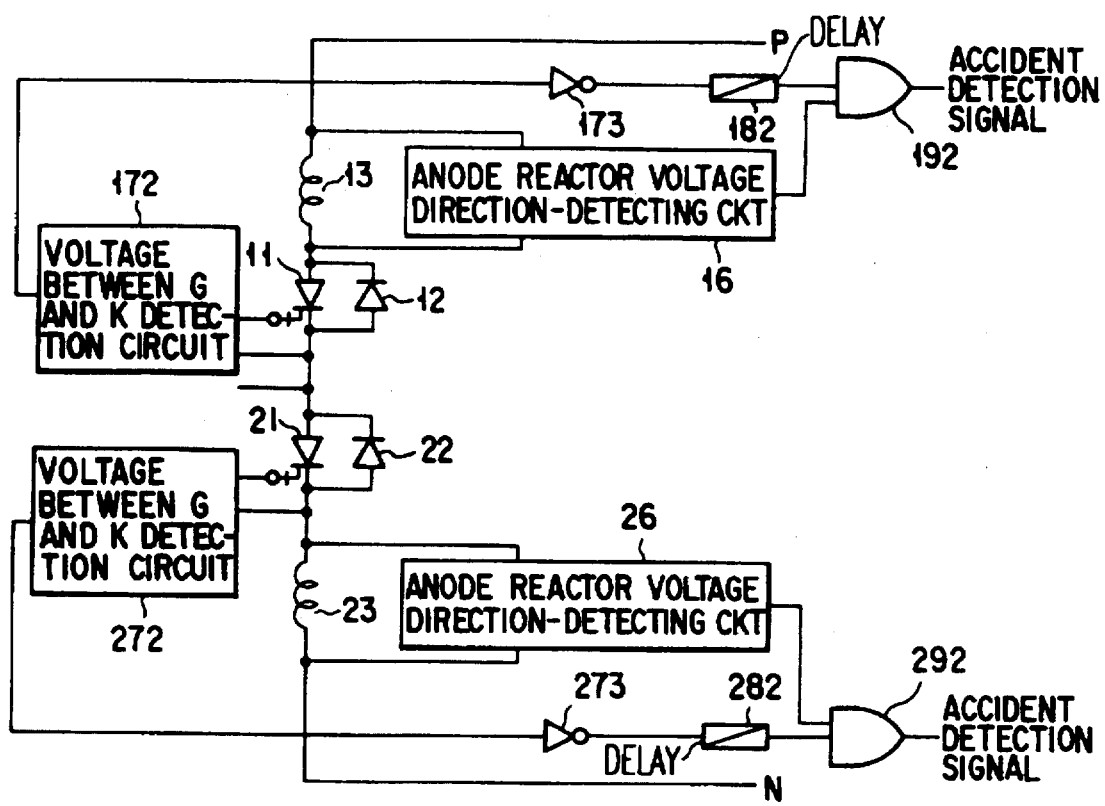
F I G. 12
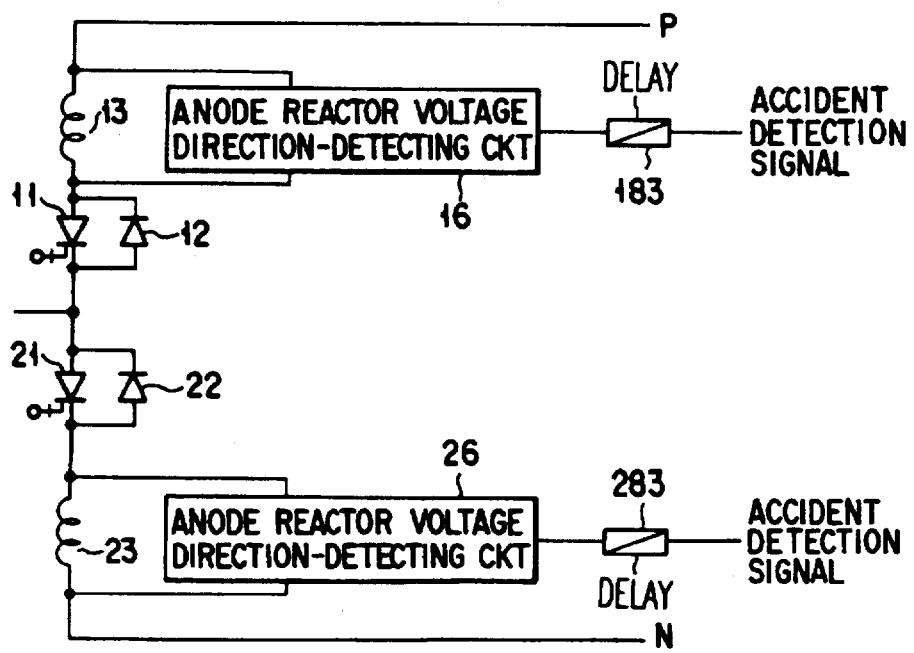
F I G. 13

ACCIDENT DETECTION CIRCUIT OF A VOLTAGE-TYPE SELF-EXCITED POWER CONVERTER

DESCRIPTION

1. Technical Field

The present invention relates to an accident detection circuit which rapidly detects accidents of a converter due to the arm short-circuit and the like, in a voltage-type self-excited power converter used in a flicker-suppressing device which suppresses flickers of the alternating current-receiving voltage, a reactive power compensating network which compensates the reactive power, and an active filter which suppresses the harmonic of the alternating current-receiving current.

2. Background Art

One example of conventional three-phase voltage-type self-excited power converter comprises 6 arm circuits, and each arm circuit is composed of a power semiconductor element of a self turn off type, a diode connected in anti-parallel to this semiconductor element, and an anode reactor connected in series to the anode of the semiconductor element and for suppressing the current rising rate.

Now, in the voltage-type self-excited power converter having such a structure, when the semiconductor element of the arm circuit on the low voltage side is continued, if the semiconductor element of the arm circuit on the high voltage side is broken or continued due to some misconduct, direct-current short-circuit accident current will flow from the direct-current circuit. Similarly, when both ends of the arm circuit on the high voltage side are short-circuited due to some accident such as flashover, or when short-circuit accidents are caused between lines on the alternating-current side of the converter, similarly the direct-current short-circuit current will flow to the semiconductor element.

Conventionally, in order to detect such accidents and protect the semiconductor element, there have been provided a current detector and an overcurrent relay for every arm circuit. These are to detect the current flowing to the arm circuit by the current detector, to detect when this detected current becomes the overcurrent exceeding a certain value with the overcurrent relay, and to interrupt the short-circuit accident current by giving an off-gate signal simultaneously to all semiconductor elements which constitute the power converter, to protect the power converter.

In said protecting method, there are disadvantages described below. That is, if it is tried to interrupt the current higher than the interruptible current value where there is a current value which can be interrupted as a rating of the semiconductor element by giving the off-gate signal, the semiconductor element will be broken.

Furthermore, in order to output the off signal for interrupting the accident current to the semiconductor element, some periods of time is required, since there is a delay time in the circuit which outputs the off-gate signal.

Therefore, in such accidents, it is required to output the off-gate signal before the accident current reaches the interruptible current value of the semiconductor element after the detection of the accident. Therefore, conventionally, considering the time delay for outputting the off-gate signal after detecting the overcurrent, the anode reactor has been made large to make the rising of the accident current slow. As a result, it leads to the increase of the circuit loss for dealing with the energy of the anode reactor at the time of normal commutation, thereby the efficiency of the power converter decreases.

Or, there is a defect that, in order to interrupt the accident current, semiconductor elements having an interrupting current rating of larger capacity than the interrupting current rating required for interrupting the current flowing at the normal operation must be used.

The object of the present invention is for removing the afore-mentioned defects, and to provide an accident detection circuit of a voltage-type self-excited power converter which can rapidly detect the accident in the self-excited power converter before the short-circuit accident current reaches the overcurrent, and detect the accident in the power converter without making the anode reactor or the power semiconductor element of self turn off type larger than being required.

DISCLOSURE OF INVENTION

The present invention includes voltage direction-detecting means, arm current direction-detecting means, and an output means. The voltage direction-detecting means detects that the voltage in the direction generated in the anode reactor when the current flowing in the direction of from the anode to the cathode of the power semiconductor element of self turn off type increases exceeds a predetermined value. The arm current direction-detecting means detects that the current flows in the direction from the anode to the cathode of the power semiconductor element of self turn off type. And, the output means delays the arm current direction-detecting signal by a certain period of time, and when this signal and the anode reactor voltage direction-detecting signal exist together, outputs the accident detection signal. Therefore, it can detect rapidly the accident in the power converter before the accident current reaches the overcurrent.

Furthermore, the present invention includes a voltage direction-detecting means, a continuity period-control means, and an output means. The voltage direction-detecting means detects that the voltage in the direction generated in the anode reactor when the current flowing from the anode to the cathode of the power semiconductor element of self turn off type increases exceeds a predetermined value. The continuity period-control means determines the timing to initiate the commutation action of the power semiconductor element of self turn off type to control the continuity period. And, the output means delays the signal which controls the continuity period by a certain period of time, and when this signal and the anode reactor voltage direction-detecting signal exist together, outputs the accident detection signal. As a result, it can detect the accident in the power converter, thereby there is no need to provide a current detector to the power converter.

Furthermore, the present invention includes voltage direction-detecting means, voltage detection means and an output means. The voltage direction-detecting means detects that the voltage in the direction generated in the anode reactor when the current flowing from the anode to the cathode of the power semiconductor element of self turn off type increases exceeds a certain value. The voltage detection means detects the off-gate voltage between the gate and the cathode of the power semiconductor element of self turn off type. The output means delays the reversed signal of the off-gate voltage-detecting signal by a certain period of time, and when this signal and the anode reactor voltage direction-detecting signal exist together, outputs the accident detection signal. As a result, it can detect the accident in the power converter, and further it can be made to detect the breakage of the power semiconductor element of self turn off type.

Furthermore, the present invention includes a voltage direction-detecting means and a delay means. The voltage direction-detecting means detects that the voltage in the direction generated in the anode reactor when the current flowing from the anode to the cathode of the power semiconductor element of self turn off type increases exceeds a predetermined value. The delay means outputs the accident detection signal, when the anode reactor voltage-detecting signal detects that a certain period of time has passed. As a result, the accident in the power converter can be detected without adding particularly a current detector or the like.

According to the accident detection circuit of the voltage-type self-excited power converter, the accident in the voltage-type self-excited power converter can be rapidly detected before the short-circuit accident current reaches the overcurrent, thereby it is not required to make the anode reactor, or the power semiconductor element of self turn off type larger than being required.

BRIEF DESCRIPTION OF DRAWINGS

FIG. 1 is a main circuit diagram showing one embodiment of the voltage-type self-excited power converter of the present invention;

FIG. 2 is a structural view showing the first embodiment of the accident detection circuit of the voltage-type self-excited power converter of the present invention;

FIG. 12 is a structural view showing the third embodiment of the accident detection circuit of voltage-type self-excited power converter of the present invention; and FIG. 13 is a structural view showing the fourth embodiment of the accident detection circuit of voltage-type self-excited power converter of the present invention.

BEST MODE FOR CARRYING OUT THE INVENTION

Figure 3:
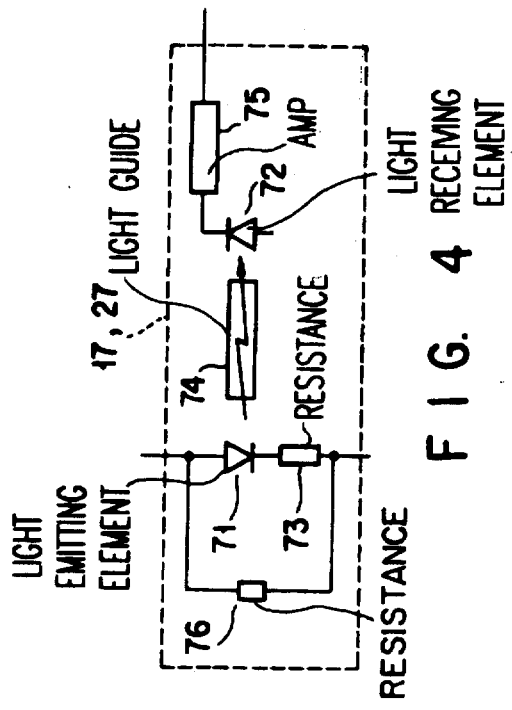
FIG. 3 is a detailed diagram of the anode reactor voltage direction-detecting circuit of FIG. 2.

The invention will now be described in detail by way of examples with reference to the accompanying drawings. First, the voltage-type self-excited power converter which is the object of the present invention will be described with reference to FIG. 1.

FIG. 1 shows a three-phase voltage-type self-excited power converter, which comprises arm circuits 1, 3 and 5 on the high voltage side, arm circuits 2, 4 and 6 on the low voltage side, and a direct current capacitor 7 to maintain the direct voltage constant, which is connected to the direct current side of arm circuits 1 to 6.

The arm circuit 1 is composed of a power semiconductor element 11 of self turn off type comprising, for example, GTO (gate turn-off thyristor), a diode 12 connected in anti-parallel to the semiconductor element 11, and an anode reactor 13 connected in series to the semiconductor element 11 and the diode 12, to suppress the current rising rate di/dt of the power semiconductor element 11 of self turn off type.

Similarly, the arm circuits 2 to 6 are composed of power semiconductor elements 21, 31, 41, 51 and 61 of self turn off type, diodes 22, 32, 42, 52 and 62 connected in anti-parallel, respectively, to the semiconductor elements 21, 31, 41, 51 and 61, and anode reactors 23, 33, 43, 53 and 63.

And to the connecting point of arm circuits 1 and 2 in the arm series circuit connecting in series arm circuits 1 and 2, to the connecting point of arm circuits 3 and 4 in the arm series circuit connecting in series arm circuits 3 and 4, and to the connecting point of arm circuits 5 and 6 in the arm series circuit connecting in series arm circuits 5 and 6, there are connected, respectively, terminals R, S and T on the alternating current side, and to both terminals of the direct current capacitor 7, there are connected terminals P and N on the direct- current side.

In addition, in order to reduce the inclination dv/dt of voltage applied to the power semiconductor elements 11 and 21 of self turn off type, generally a snubber circuit is arranged in parallel to the power semiconductor elements 11 and 21 of self turn off type. And to deal with the energy stored in the anode reactor at the time of commutation, a reactor energy regenerative circuit or a circuit which connects in series a resistance and a diode is connected in parallel to the anode reactors 13 and 23, but the description thereof is omitted since these circuits do not have the direct relationship with the present invention.

<First Embodiment>

FIG. 2 is a view showing the first embodiment of the present invention, and in the arm circuit 1 of FIG. 1, there are provided an anode reactor voltage direction-detecting circuit (CKT) 16 which is one example of the voltage direction-detecting means of the present invention, a current detector 14 which is one example of the arm current direction-detecting means of the present invention, an arm current direction-detecting circuit 17, a delay circuit 18 which is one example of the delay means of the present invention, and an AND circuit 19 which is one example of the output means of the present invention, and in the arm circuit 2, there are provided an anode reactor voltage direction-detecting circuit (CKT) 26 which is one example of the arm current direction-detecting means of the present invention, a current detector 24 which is one example of the arm current direction-detecting means of the present invention, an arm current direction-detecting circuit 27, a delay circuit 28 which is one example of the delay means of the present invention, and an AND circuit 29 which is one example of the output means of the present invention.

The anode reactor voltage direction-detecting circuit 16 is connected in parallel to the anode reactor 13, and detects that the voltage in the direction generated in the anode reactor 13 exceeds a predetermined value, when the current flowing in the direction of from the anode to the cathode of the semiconductor element 11 increases. The anode reactor voltage direction-detecting circuit 26 is connected in parallel to the anode reactor 23, and detects that the voltage in the direction generated in the anode reactor 23 exceeds a predetermined value, when the current flowing in the direction of from the anode to the cathode of the semiconductor element 21 increases.

The arm current direction-detecting circuit 17 inputs the current detected by the current detector 14, and detects that the current flows in the direction of from the anode to the cathode of the semiconductor element 11. The arm current direction-detecting circuit 27 inputs the current detected by the current detector 24, and detects that the current flows in the direction from the anode to the cathode of the semiconductor element 21. The anode reactor voltage direction-detecting circuits 16 and 26 are similar circuits with a forward voltage detector which is applied to the semiconductor element for the electric power constituting a high-voltage separately excited converter, and are composed of a light-emitting element 61, a light-receiving element 62, a resistance 63, a light guide 64 and an amplifying circuit 65, as shown in FIG. 3.

The delay circuit 18 is to delay the output signal of the arm current direction-detecting circuit 17 by a certain period of time. And the delay circuit 28 is to delay the output signal of the arm current direction-detecting circuit 27 by a certain period of time.

The AND circuit 19 inputs the output signal of the anode reactor voltage direction-detecting circuit 16 and the output signal of the delay circuit 18, and outputs an output signal, that is, an accident detection signal when both the output signals exist simultaneously. The AND circuit 29 inputs the output signal of the anode reactor voltage direction-detecting circuit 26 and the output signal of the delay circuit 28, and outputs an output signal, that is, an accident detection signal when both the output signals exist simultaneously.

Figure 4:
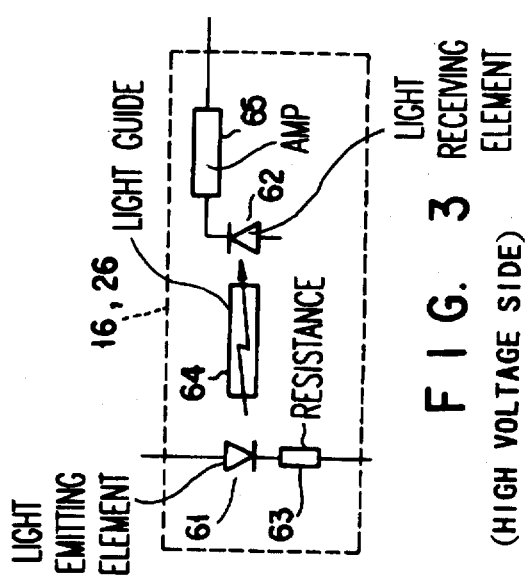
FIG. 4 is a detailed diagram of the arm current direction-detecting circuit of FIG. 2.

The arm current direction-detecting circuits 17 and 27 are similar circuits with the overcurrent relays 15 and 25 of FIG. 14, and either of them is composed of a light-emitting element 71, a light-receiving element 72, a resistance 73, a light guide 74, an amplifying circuit 75, and a resistance 76, as shown in FIG. 4, and they are so constituted as to flow the current detected by the current detectors 14 and 24 to the light-emitting element 71 and to detect it with the light-receiving element 72.

The arm current direction-detecting circuits 17 and 27 may be composed of a level determination circuit which determines whether the current detected by the current detectors 14 and 24 of FIG. 2 is positive or negative, differing from those shown in FIG. 4.

The action and effect of the first embodiment so constituted as described above will now be described with reference to FIGS. 5 to 9. First, in order to help the understanding of the accident detection method, the operation method of the voltage-type self-excited power converter and the phenomenon at the time of accident will be described, taking R-phase as an example.

The voltage-type self-excited power converter is operated by a known technique such as the PWM control and the like. One example of the method of PWM control and the phenomenon at the time of commutation is described in page 108 and page 31 of "Semiconductor power converting circuit" published by the Electricity Society (the first edition: Mar. 31, 1987), therefore detailed description will be omitted.

Figure 5:
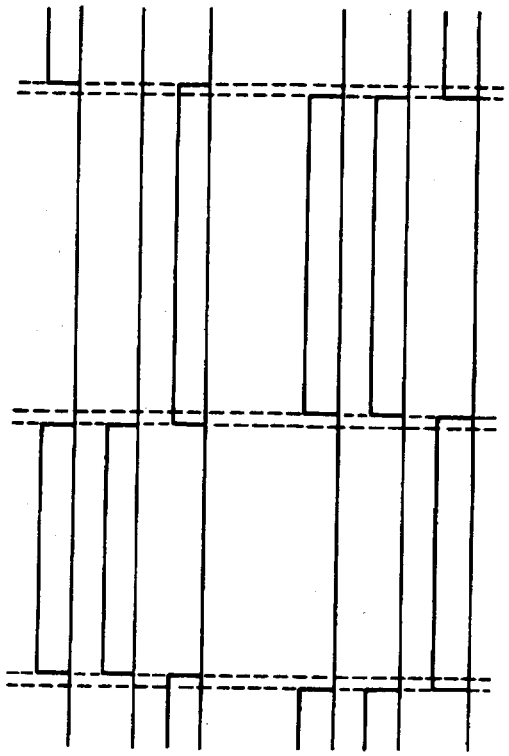
FIG. 5 is a timing chart showing the continuity period-control signal, the on-gate signal and the off-gate signal for illustrating the action of the first embodiment of the present invention.

As shown in FIG. 5, the on-gate signal and the off-gate signal are given alternately to the power semiconductor elements 11 and 21 of self turn off type which constitute the arm circuits 1 and 2, so that the current is not applied simultaneously to the arm circuit 1 on the high-voltage side and to the arm circuit 2 on the low voltage side to cause any direct-current short-circuit accident. In addition, the control device of the self-excited power converter is operated under the signal which determines the timing to determine the initiation of the commutation action and controls the continuity period of the arm circuits 1 and 2 on the low voltage side and the high voltage side.

Namely, for example, when the current is commutated from the arm circuit 2 on the low voltage side to the arm circuit 1 on the high voltage side, the voltage-type self-excited power converter is operated so that the on-gate signal is given to the power semiconductor element 11 of self turn off type which constitutes the arm circuit 1 after interrupting the power semiconductor element 21 of self turn off type of the arm circuit 2 by giving the off-gate signal thereto. As a result, the voltage waveform on the alternating-current side of the power converter becomes a collected body of the voltage waveform of the rectangular wave which designates the direct-current voltage as the peak value thereof, which is a common knowledge.

Figure 6:
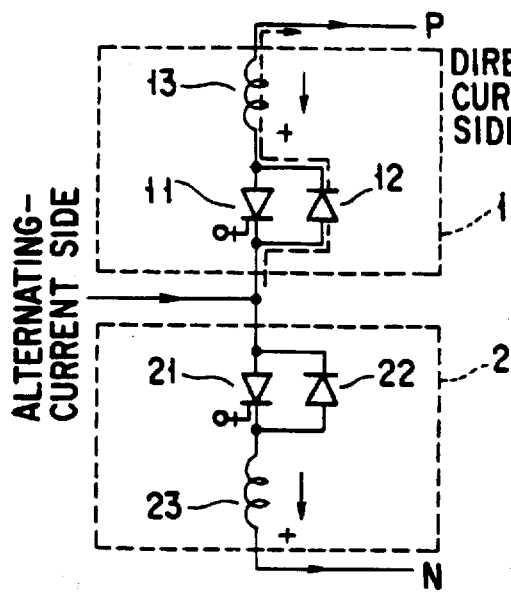
FIG. 6 is a diagram illustrating the commutation action when the current flows to the power semiconductor element of self turn off type of FIG. 2.

As is shown in FIG. 6, at the time of normal commutation, if the off-gate signal is given to the power semiconductor element 21 of self turn off type when the current is flown to the power semiconductor element 21 of self turn off type of the arm circuit 2 on the low voltage side, the current flowing to the power semiconductor element 21 of self turn off type is interrupted. As a result, the current flowing to the anode reactor 23 on the low voltage side is also attenuated, thereby the voltage having a polarity as shown in FIG. 6, that is, the voltage in the direction generated when the current flowing from the anode to the cathode of the power semiconductor element 21 of self turn off type decreases is generated in the anode reactor 23. Furthermore, as shown in FIG. 6 by a dotted line, since the current on the alternating-current side flows to the arm circuit 1 on the high voltage side by interrupting the power semiconductor element 21 of self turn off type, the voltage having the polarity as shown in FIG. 6 is generated transitionally in the anode reactor 13 on the high voltage side.

Figure 7:
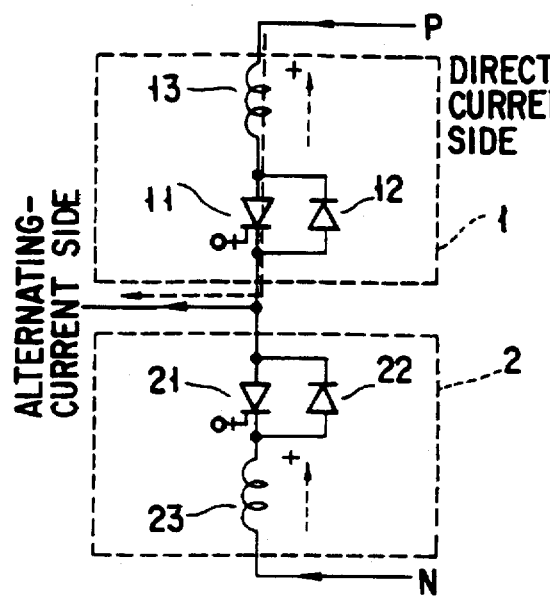
FIG. 7 is a diagram illustrating the commutation action when the current flows to the diode of FIG. 2.

As shown in FIG. 7, however, the commutation action is not performed even if the off-gate signal is given to the power semiconductor element 21 of self turn off type on the low voltage side, in order to perform the commutation action when the diode 22 of the arm circuit 2 on the low voltage side continues and the current flows via the diode 22. But, when the on-gate signal is given to the power semiconductor element 11 of self turn off type on the high voltage side, the commutation action is started. As shown in FIG. 6 by a dotted line, during the commutation period when the current flowing from the diode 22 to the alternating-current side is changed to flow toward the alternating-current side via the power semiconductor element 11 of self turn off type, the voltage in the direction generated when the current flowing from the anode to the cathode of the power semiconductor element 21 of self turn off type increases is applied to the anode reactor 23. Similarly, at this time, the voltage is applied also to the anode reactor 13 on the high voltage side, and the value thereof is roughly half of the direct-current voltage.

Now, in order to simplify the description of the action of the first embodiment, let's consider the case where the power semiconductor element 11 of self turn off type of the arm circuit 1 on the high voltage side is broken due to some misconduct, or both ends of the arm circuit 1 on the high voltage side is short-circuited due to flashover or the like, when the power semiconductor element 21 of self turn off type constituting the arm circuit 2 on the low voltage side is in the continuity period.

If the power semiconductor element 11 of self turn off type is broken or continued due to some misconduct when the current flows to the power semiconductor element 21 of self turn off type on the low voltage side, the short-circuit current flows from the P side of the direct-current circuit to the N side of the direct-current circuit via circuits of the anode reactor 13, the power semiconductor element 11 of self turn off type, the power semiconductor element 21 of self turn off type, and the anode reactor 23, as shown in FIG. 7. Therefore, the voltage of the direct-current capacitor 7 is shared with the anode reactor 13 on the high voltage side and the anode reactor 23 on the low voltage side substantially half-and-half, and the direction of the voltage applied to the anode reactors 13 and 23 is the same as the voltage in the direction that the current flowing from the anode to the cathode of the power semiconductor elements 11 and 21 of self turn off type increases, that is, the voltage having the polarity shown in FIG. 8.

Figure 8:
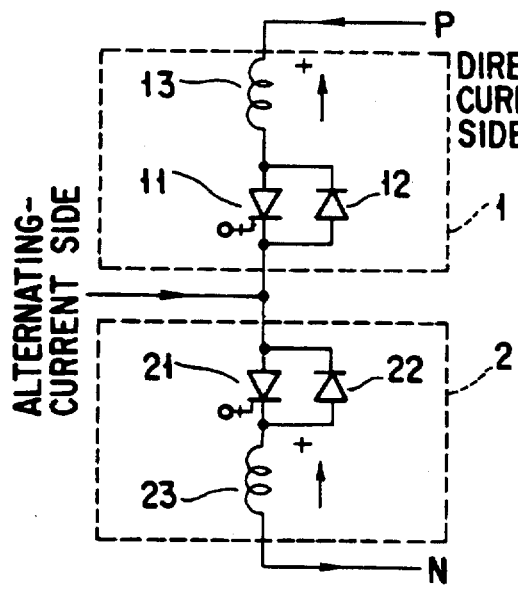
FIG. 8 is a diagram illustrating the phenomenon at the time of accident when the current flows to the power semiconductor element of self turn off type of FIG. 2.
Figure 9:
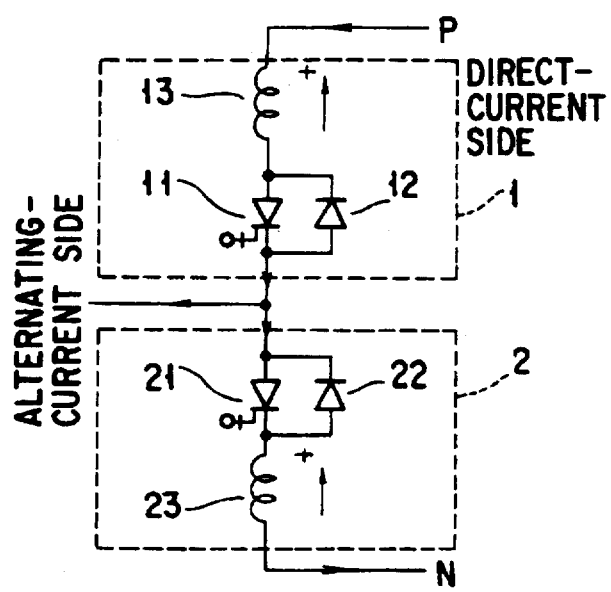
FIG. 9 is a diagram illustrating the phenomenon at the time of accident when the current flows to the diode of FIG. 2.

If the power semiconductor element 11 of self turn off type is broken or continued due to some misconduct when the current flows to the diode 22 on the low voltage side, the short-circuit current will flow, as shown in FIG. 9. The initial stage of the accident is similar to the normal commutation as shown in FIG. 7, but since the power semiconductor element 21 of self turn off type is supplied with the on-gate signal because of being in the continuity period, the short-circuit current flows backward through the diode 22 on the low voltage side, and then via the power semiconductor element 21 of self turn off type on the low voltage side. It is completely the same as in FIG. 8 which illustrates the case where the current flows to the power semiconductor element 21 of self turn off type on the low voltage side, except that the current flows in from the alternating-current side. To the anode reactor 23 on the low voltage side, there is applied a voltage having the polarity shown in FIG. 9, that is, a voltage in the direction generated when the current flowing in the direction of from the anode to the cathode of the power semiconductor element 21 of self turn off type increases.

Also in the case where both ends of the arm circuit 1 on the high voltage side are short-circuited due to flashover or the like, it is clear that a voltage corresponding to the direct voltage having a polarity shown in FIGS. 8 and 9 is generated in the anode reactor 23 on the low voltage side. Furthermore, in the case where a short-circuit between lines is generated on the alternating-current side, if, for example, a short-circuit between lines of the R phase and the S phase is generated while the arm circuit 2 on the low voltage side of the R phase and the arm circuit 3 on the high voltage side of the S phase are continued, it is clear that the voltage in the direction generated when the current flowing from the anode to the cathode of the power semiconductor element 31 of self turn off type of the arm circuit 3 increases is applied to the anode reactor 33 provided in the arm circuit 3 on the high voltage side of the S phase. It is a matter of course that the voltage in the similar direction is applied to the anode reactor 23 on the low voltage side of the R phase.

As described above, the direction of the voltage applied to the anode reactor 23 on the low voltage side at the time of accident shown in FIGS. 8 and 9 is of the polarity in the reverse direction as that of the voltage generated in the anode reactor 23 on the low voltage side when the current is commutated to the arm circuit 1 on the high voltage side, when the power semiconductor element 21 of self turn off type on the low voltage side shown in FIG. 5 is continued. Therefore, if a voltage in the direction which increases the current flowing from the anode to the cathode of the power semiconductor element 21 of self turn off type is generated in the anode reactor 23, it shows the possibility that some accident is caused in the power converter.

However, as the action to commutate the current to the arm circuit 2 on the high voltage side from the state that the diode 22 is continued is described in FIG. 7, when the current flows to the diode 22 on the low voltage side, a voltage in the direction generated when the current flowing from the anode to the cathode of the power semiconductor element 21 of self turn off type increases is applied to the anode reactor 23 on the low voltage side, similarly as in the case of accident. However, at the time of normal commutation, when a voltage is applied to the anode reactor 23 on the low voltage side in the direction which increases the current flowing from the anode to the cathode of the power semiconductor element 21 of self turn off type, the current flowing to the arm circuit 2 is the one flowing via the diode 22, and the one flowing in the direction of from the cathode to the anode of the power semiconductor element 21 of self turn off type.

Therefore, when the current flowing to the arm circuit 2 on the low voltage side flows in the direction of from the anode to the cathode of the power semiconductor element 21 of self turn off type, and if a voltage in the direction generated in the anode reactor 23 on the low voltage side when the current flowing in the direction from the anode to the cathode of the power semiconductor element 21 of self turn off type increases is applied to the anode reactor 23, it means that this is not a normal commutation action but an accident is caused.

Furthermore, in the above description, the description is made for the case that the arm circuit 2 on the low voltage side is continued, for simplifying the description, but it is clear that also in the case where the arm circuit 1 on the high voltage side is continued, an accident of the voltage-type self-excited power converter can be similarly detected by replacing the low voltage side with the high voltage side, and the high voltage side with the low voltage side in the above description.

Therefore, if the high voltage side in the above description is replaced with the non-continued side, it is clear that in the case of an accident that the arm circuit on the non-continued side is continued, an accident that both ends of the arm circuit 1 on the non-continued side is short-circuited, or an accident of short-circuit between lines, and when the current flows from the anode to the cathode of the power semiconductor element of self turn off type in the arm circuit 2, if it can be detected that the voltage in the direction generated in the anode reactor when the current flowing from the anode to the cathode of the power semiconductor element of self turn off type increases exceeds a certain value, it is possible to detect the occurrence of an accident at high speed, before the accident current reaches, as in the conventional case, the overcurrent region.

Incidentally, the reason to detect the voltage higher than a certain value of the anode reactors 13 and 23 is that since the self-excited power converter lets the alternating current flow to the alternating side, the voltage of the alternating current, that is, the voltage having a polarity in the both directions appears in the anode reactors 13 and 23, with the change of the alternating current. Therefore, it is necessary to detect the voltage higher than a certain value so as not to detect the voltage generated in the anode reactors 13 and 23 due to the current change during the normal operation. However, the voltage generated in the anode reactors 13 and 23 due to the normal current change has quite small value compared to that of the direct voltage, because of a small inductance value, and the peak value of the waveform of the alternating voltage substantially equals to the value of the direct voltage.

On the other hand, the voltage generated in the anode reactors 13 and 23 at the time of accidents has a quite large value compared to the voltage generated by the normal current change, and as already described, it has a voltage value of substantially half of the direct voltage or higher. Namely, the increase rate of the current at the time of accidents has quite a large value than that generated normally.

Therefore, according to the first embodiment, anode reactor voltage direction-detecting circuits 16 and 26 which detect the direction of the voltage applied to the anode reactors 13 and 23 are provided in parallel to the anode reactors 13 and 23 and detect that the voltage in the direction generated in the anode reactors 13 and 23 when the current flowing in the direction of from the anode to the cathode of the power semiconductor elements 11 and 21 of self turn off type increases exceeds a predetermined value. Namely, it is detected by the voltage generated in the anode reactors 13 and 23 that when the current flows to the power semiconductor elements 11 and 21 of self turn off type in the direction from the anode to the cathode, the current flowing to the power semiconductor elements 11 and 21 of self turn off type in the direction from the anode to the cathode increases at the current increase rate higher than that generated by a normal operation.

However, at the time of normal commutation, since the voltage having the same polarity with the polarity at the time of accident is generated in the anode reactors 13 and 23, current direction-detecting circuits 17 and 27 which detect the direction of the current flowing to the arm circuits 1 and 2 are provided to the arm circuits 1 and 2, in order to determine whether it is a phenomenon at the time of normal commutation or a phenomenon at the time of accident, and detect that the current flows in the direction of from the anode to the cathode of the power semiconductor elements 11 and 21 of self turn off type.

Delay circuits 18 and 28 which delay the output signal of the arm current direction-detecting circuits 17 and 27 by a certain period of time are provided, and AND circuits 19 and 29 which designate the output signal of the anode reactor voltage direction-detecting circuits 16 and 26 and the output signal of the delay circuits 18 and 28 as the input signal are provided, thus the accident of the converter can be detected at high speed by distinguishing it from the phenomenon at the time of normal commutation, from the state that the anode reactor voltage-detecting circuits 16 and 26 are operating, when certain period of time has passed since the arm current direction-detecting circuits 17 and 27 operated.

Now, the reason why the arm current direction-detecting signal is delayed by a certain period of time will be described. In the same way as the description of the commutation action shown in FIG. 7, the action to commutate the current to the arm circuit 1 on the high voltage side in the state that the current flows to the diode 22 on the low voltage side will be described. When the on-gate signal is given to the power semiconductor element 11 of self turn off type on the high voltage side, in the state that the current flows to the diode 22 on the low voltage side, to commutate the current on the high voltage side, the current will flow to the power semiconductor element 11 of self turn off type in the direction of from the anode to the cathode, and to the anode reactor 13 on the high voltage side is applied a voltage in the direction generated when the current flowing from the anode to the cathode of the power semiconductor element 11 of self turn off type increases. Therefore, if the commutation action toward the high voltage side is performed when the diode 22 on the low voltage side is continued, such a problem is caused that the accident detection circuit on the high voltage side operates. In order to solve this problem, it is necessary to delay the signal which detects the current flowing in the direction of from the anode to the cathode, during the time until the voltage generated in the anode reactors 13 and 23 disappear after the completion of commutation.

However, since there are provided circuits for detecting accidents both in the arm circuits 1 and 2 on the high voltage side and the low voltage side, as is obvious from the above description, if an accident occurs simultaneously as the commutation action toward the high voltage side is performed when the diode 22 on the low voltage side is continued, the accident is detected after a period of time determined by the time delay of the delay circuit. However, since this time delay is essentially cooperative with the normal commutation time of the current, the accident current when the accident is detected is as large as the current which performs the normal commutation action, and the condition of the input signal of the AND circuit is satisfied before the accident current reaches the over current, thereby the accident can be detected.

The action of the first embodiment will now be described, assuming that, as in the above description, the arm circuit 1 on the high voltage side is broken due to some misconduct, or is continued, or both ends of the arm circuit 1 on the high voltage side are short-circuited, when the arm circuit 2 on the low voltage side is continued. Here, the description will be made assuming that the arm circuit 1 on the high voltage side is broken due to some misconduct, or is continued, or both ends of the arm circuit 1 on the high voltage side are short-circuited, when the arm circuit 2 on the low voltage side is continued.

When an accident occurs, or when the on-gate signal is given to the power semiconductor element 11 of self turn off type in the state that the current flows to the diode 22 on the low voltage side, the current flowing in the direction of from the anode to the cathode of the power semiconductor elements 11 and 21 of self turn off type increases, and a voltage having a polarity shown in FIG. 7, that is, in the direction generated when the current flowing in the direction of from the anode to the cathode of the power semiconductor elements 11 and 21 of self turn off type increases is applied to the anode reactors 13 and 23.

As a result, the current flows to the light-receiving element 61 which constitutes the anode reactor voltage direction-detecting circuits 16 and 26 shown in FIG. 3 to emit the light. The emitted light is guided to the light-receiving element 62 by the light guide 64, and by the reciprocal action with the amplifying circuit 65, it can be detected that a voltage is applied to the anode reactor. At this time, the voltage value which can be detected by selecting properly the resistance value connected in series to the light-emitting element 61 can be set optionally. Accordingly, if the voltage detection value of the anode reactor voltage direction-detecting circuits 16 and 26 is set to a certain value which is not detected at the current increase rate during the normal operation, the anode reactor voltage direction-detecting circuit 16 will operate when the on-gate signal is given to the power semiconductor element 11 of self turn off type, when an accident occurs, or in the state that the current flows to the diode 22 on the low voltage side, and it will not operate during the normal operation.

In addition, when a voltage in which the current decreases in the direction of from the anode to the cathode of the power semiconductor elements 11 and 21 of self turn off type is generated in the anode reactors 13 and 23, since the direction of the voltage is inverse to the direction described above, the current does not flow to the light-emitting element 61, therefore the anode reactor voltage direction-detecting circuits 16 and 26 will not operate.

Next, if the on-gate signal at the time of commutation is given to the power semiconductor element 11 of self turn off type on the high voltage side, the current will flow to the arm circuit 1 in the direction of from the anode to the cathode of the power semiconductor element 11 of self turn off type, thereby the current will flow to the light-emitting element 71 which constitutes the arm current direction-detecting circuits 17 and 27 shown in FIG. 4 to emit the light, and this light will be guided to the light-receiving element 72 by the light guide 74, and the electric signal obtained here will be amplified by the amplifying circuit 75. On the other hand, when the current flows to the arm circuits 1 and 2 in the direction of from the cathode to the anode of the power semiconductor element 11 of self turn off type, the arm current direction-detecting circuits 17 and 27 will not operate, and the detecting action will not be performed.

If it is a commutation action when the diode 22 on the low voltage side is continued, the arm current direction-detecting circuit 17 on the high voltage side will operate, but the signal is not input to the AND circuit 19 by means of the action of the delay circuit 18. Therefore, if the delay time of the delay circuit 18 is set so that there is caused a time delay corresponding to the commutation time at the normal current, any voltage is not generated in the anode reactor 13 after this commutation time has passed, therefore the anode reactor voltage direction-detecting circuit 16 does not operate. Accordingly, since the input condition of the AND circuit 19 is not satisfied, the accident detection circuit of the present embodiment will not operate.

In the case of accident that the arm circuit 1 on the high voltage side is continued in the state that the current flows to the diode 22 on the low voltage side, however, it is clear from the above description that the accident detection circuit on the high voltage side operates after a certain period of time has passed since the accident occurred.

Furthermore, it is also clear that the accident detection circuit on the low voltage side operates after a certain period of time since the current started to flow to the arm circuit 2 on the low voltage side in the direction of from the anode to the cathode of the power semiconductor element 21 of self turn off type.

Furthermore, when the current flows to the power semiconductor element 21 of self turn off type, since the condition to be input from the arm current direction-detecting circuit 27, via the delay circuit 28, to the AND circuit 29 has already been realized in the place where the accident occurred, it is clear that the anode reactor voltage direction-detecting circuit 26 operates at the time of occurrence of the accident, and this detection circuit operates immediately.

The above description assumes an accident that the arm circuit 1 on the high voltage side is continued, however, also in the case of accident that both ends of the arm circuit 1 on the high voltage side are short-circuited, or in the case of accident between lines of R-phase and S-phase, the delay circuit 28 on the post stage of the arm current direction-detecting circuit 27 on the low voltage side has already operated, or operates after a certain period of time has passed since an accident occurred, and the anode reactor voltage direction-detecting circuit 26 operates immediately after the occurrence of accident, thereby the accident detection circuit of the present embodiment will operate.

The above description applies similarly even if the low voltage side is replaced with the high voltage side, and the high voltage side is replaced with the low voltage side, therefore, the accident detection circuit of the present embodiment can rapidly detect the accident of the power converter, regardless of accidents on the high voltage side or on the low voltage side of the converter.

Furthermore, the above description has been made assuming that an accident occurs that the arm circuit on the high voltage side is continued, but when it is an accident that both ends of the arm circuit 1 on the high voltage side are short-circuited, the accident detection circuit on the high voltage side will not operate, but it is clear that the circuit on the low voltage side operates similarly to detect the accident. Moreover, the accident is similarly detected when a short-circuit accident between lines is caused.

Therefore, if an accident occurs, the anode reactor voltage direction-detecting circuits 16 and 26 immediately operate, and if the accident current flows to the arm circuit in the direction of from the anode to the cathode of the power semiconductor element of self turn off type, the arm current direction-detecting circuits 17 and 27 will operate, and the accident can be detected by the output signal to the AND circuits 19 and 29.

On the other hand, since the output signal does not appear to the AND circuits 19 and 29 by means of the delay circuits 18 and 28 at the time of normal commutation, an accident of the power converter can be rapidly detected by the accident detection circuit.

<Second Embodiment>

Figure 10:
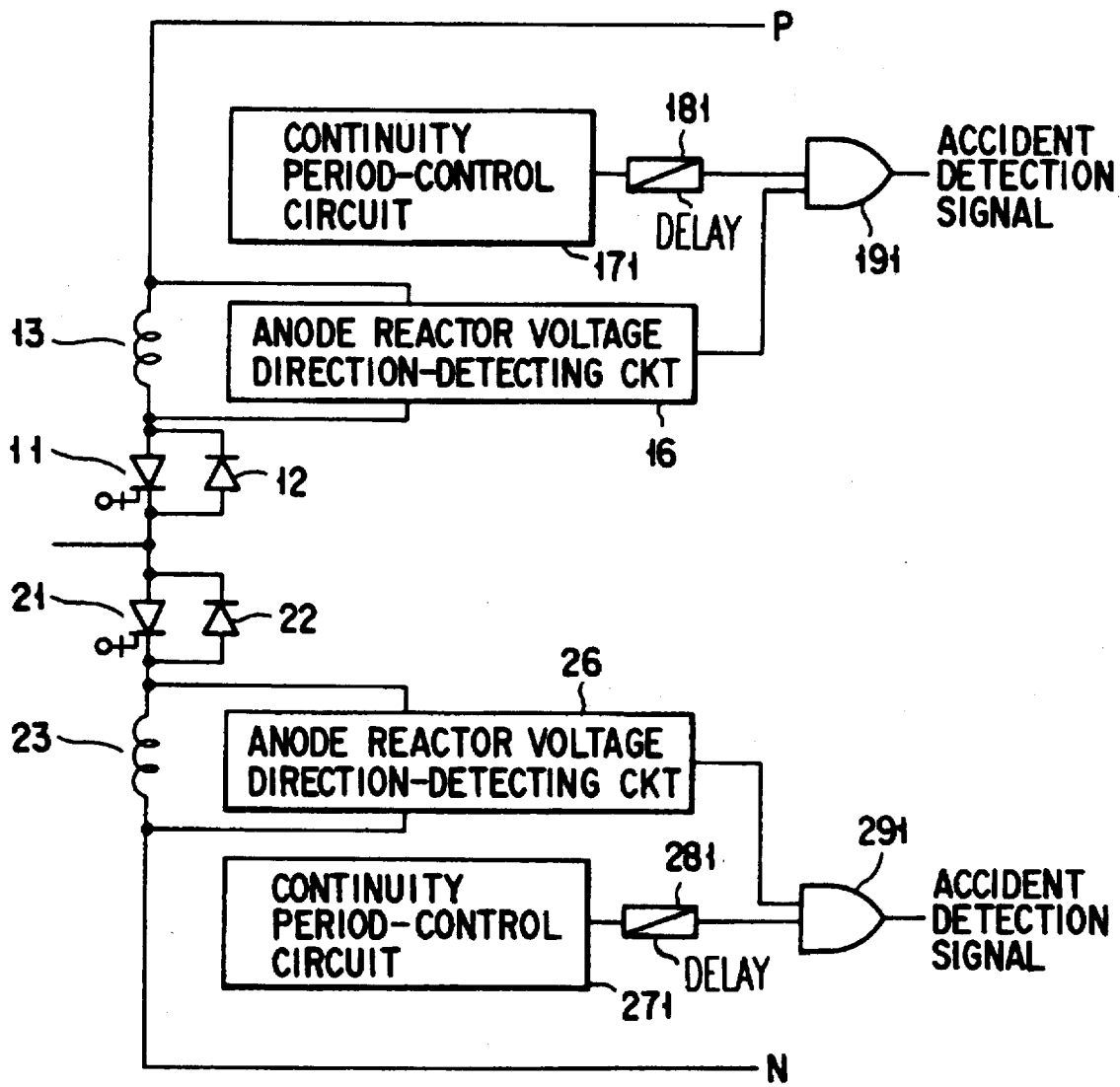
FIG. 10 is a structural view showing the second embodiment of the accident detection circuit of voltage-type self-excited power converter of the present invention.

FIG. 10 shows the second embodiment of the present invention, and the same parts with FIG. 2 are denoted with the same reference numerals and the description thereof is omitted. The different point therewith, that is, continuity period-control circuits 171 and 271, delay circuits 181 and 281, and AND circuits 191 and 291 will be described here.

The continuity period-control circuit 171 controls the continuity period of the power semiconductor element 11 of self turn off type on the high voltage side, and the continuity period-control circuit 271 controls the continuity period of the power semiconductor element 21 of self turn off type on the low voltage side. The delay circuit 181 delays the output signal of the continuity period-control circuit 171 by a predetermined period of time, and the delay circuit 281 delays the output signal of the continuity period-control circuit 271 by a predetermined period of time. The AND circuit 191 inputs the output signal of the delay circuit 181 and the output signal of the anode reactor voltage direction-detecting circuit 16, and outputs the accident detection signal when both output signals are simultaneously input. And the AND circuit 291 inputs the output signal of the delay circuit 281 and the output signal of the anode reactor voltage direction-detecting circuit 26, and outputs the accident detection signal when both output signals are simultaneously input.

As described above, the self-excited power converter determines the timing to initiate the commutation action of the power semiconductor elements 11 and 21 of self turn off type, and is operated by a signal which controls the continuity period.

Figure 11:
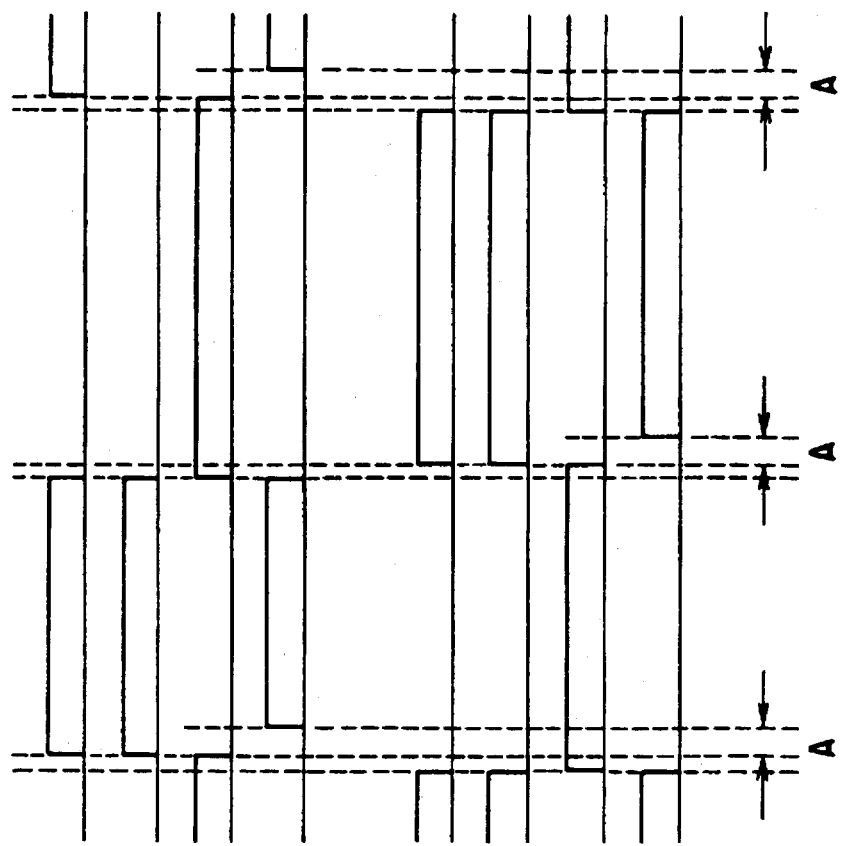
FIG. 11 is a timing chart showing the continuity period-control signal, the on-gate signal and the off-gate signal for illustrating the action of the second embodiment of the present invention.

Furthermore, when the commutation action is performed similarly as at the time of accident, the voltage in the direction generated in the anode reactors 13 and 23 when the current flowing in the direction of from the anode to the cathode of the power semiconductor elements 11 and 21 of self turn off type increases is applied to the anode reactors 13 and 23 for the period of A immediately after the on-gate signal is given to the power semiconductor elements 11 and 21 of self turn off type, when the current flows to diodes 12 and 22, as shown in FIG. 11.

Therefore, as shown in FIG. 11, if it is detected from the output signal of the continuity period-control circuits 171 and 271 that it is the continuity period after a certain period of time has passed immediately after the commutation of the power semiconductor elements 11 and 21 of self turn off type, by using the delay circuits 181 and 281, the period other than the phenomenon immediately after the commutation can be determined, thereby an accident can be detected by the signal detected by the anode reactor voltage direction-detecting circuits 16 and 26 and the logical multiplication. Namely, AND circuits 191 and 291 are provided which designate the output signals of the anode reactor voltage direction-detecting circuits 16 and 26, and the output signals of the delay circuits 181 and 281 as the input signal. And, when a signal controlling the continuity period of the power semiconductor elements 11 and 21 of self turn off type has passed for more than a certain period of time, the anode reactor voltage direction-detecting circuits 16 and 26 are operating, thereby an accident of the power converter can be rapidly detected, distinguished from the phenomenon at the time of normal commutation.

According to the accident detection circuit of the second embodiment described above, the following effects can be obtained in addition to the effect of the afore-mentioned first embodiment. Since the current of the arm circuits 1 and 2 is not detected, as is the case of the embodiment of FIG. 2, it is not required to provide the current detectors 14 and 24 in the arm circuits 1 and 2.

<Third Embodiment>

FIG. 12 shows the third embodiment of the present invention, and the same parts with FIG. 2 are denoted with the same reference numerals and the description thereof is omitted. The different point therewith, that is, voltage between G and K detection circuits 172 and 272, inverter circuits 173 and 273, delay circuits 182 and 282, and AND circuits 192 and 292 will be described here.

The voltage between G and K detection circuit 172 detects the off-gate voltage between G (gate) and K (cathode) of the power semiconductor element 11 of self turn off type, and the voltage between G and K detection circuit 272 detects the off-gate voltage between G (gate) and K (cathode) of the power semiconductor element 21 of self turn off type.

The inverter circuit 173 inverts the output signal of the voltage between G and K detection circuit 172 and the inverter circuit 273 inverts the output signal of the voltage between G and K detection circuit 272. The delay circuit 182 delays the output signal of the inverter circuit 173 by a predetermined period of time, and the delay circuit 282 delays the output signal of the inverter circuit 273 by a predetermined period of time. The AND circuit 192 inputs the output signal of the delay circuit 182 and the output signal of the anode reactor voltage direction-detecting circuit 16, and outputs the accident detection signal when both output signals are simultaneously input. And the AND circuit 292 inputs the output signal of the delay circuit 282 and the output signal of the anode reactor voltage direction-detecting circuit 26, and outputs the accident detection signal when both output signals are simultaneously input.

According to the accident detection circuit of the third embodiment described above, the following effects can be obtained in addition to the effect of the aforementioned first embodiment. The anode reactor voltage direction-detecting circuits 16 and 26 which detect the direction of voltage applied to the anode reactors 13 and 23 are provided in parallel to the anode reactors 13 and 23, to detect that the voltage in the direction generated in the anode reactors 13 and 23 when the current flowing in the direction of from the anode to the cathode of the power semiconductor elements 11 and 21 of self turn off type increases exceeds a certain value. However, even at the time of normal commutation, a voltage having the same polarity as the polarity at the time of accident is generated in the anode reactors 13 and 23, therefore it is necessary to determine whether it is a phenomenon at the time of normal commutation or it is a phenomenon at the time of accident.

Therefore, in the embodiment of FIG. 12, voltage between G and K detection circuits 172 and 272 for detecting the off-gate voltage between gate and cathode of the power semiconductor elements 11 and 21 of self turn off type are provided, thereby the continuity state of the power semiconductor elements 11 and 21 of self turn off type can be detected, including the breakage of the semiconductor elements 11 and 21.

Therefore, the output signals of the voltage between G and K detection circuits 172 and 272 are inverted via the inverter circuits 173 and 273, respectively, and these inverted signals are delayed by a certain period of time by the delay circuits 182 and 282 to determine that the power semiconductor elements 111 and 21 of self turn off type are in the continuity period when a certain period of time has passed immediately after the commutation. And the output signals of the anode reactor voltage direction-detecting circuits 16 and 26, and the output signals of the delay circuits 182 and 282 are input to the AND circuits 192 and 292. Therefore, an accident of the power converter can be rapidly detected from the state that the anode reactor voltage direction-detecting circuits 16 and 26 are operating when the power semiconductor elements 11 and 21 of self turn off type are continued, and the breakage of the power semiconductor elements 11 and 21 of self turn off type can be also detected.

<Fourth Embodiment>

FIG. 13 shows the fourth embodiment of the present invention, and the same parts with FIG. 2 are denoted with the same reference numerals and the description thereof is omitted. The different point therewith will be described here. Namely, a delay circuit 183 is provided on the output side of the anode reactor voltage direction-detecting circuit 16, the output signal of the anode reactor voltage direction-detecting circuit 16 is delayed by a certain period of time, and the output signal obtained from the delay circuit 183 is dealt with as the accident detection signal. Furthermore, a delay circuit 283 is provided on the output side of the anode reactor voltage direction-detecting circuit 26, the output signal of the anode reactor voltage direction-detecting circuit 26 is delayed by a certain period of time, and the output signal obtained from the delay circuit 283 is dealt with as the accident detection signal.

According to the fourth embodiment thus constituted, the action and effects described below can be obtained. It is as described above that the voltage applied to the anode reactors 13 and 23 has a quite small value compared to the voltage at the time of accident, in the state that the transitional phenomenon at the time of commutation has completed and the current at the normal operation flows to the anode reactors 13 and 23. Namely, after the time required for the normal commutation of the current has passed, almost no voltage is generated in the anode reactors 13 and 23. Therefore, since the delay circuits 193 and 293 which delay the anode reactor detecting signal by a certain period of time are provided, accidents of the power converter can be detected, distinguished from the phenomenon at the time of normal commutation, from the state that the anode reactor voltage direction-detecting circuits 16 and 26 has been operating for more than a certain period of time.

In the embodiments described above, the three-phase circuit comprising the arm series circuit connecting in series arm circuits 1 and 2, the arm series circuit connecting in series arm circuits 3 and 4, and the arm series circuit connecting in series arm circuits 5 and 6 shown in FIG. 1 is mentioned as the voltage-type self-excited power converter. But the present invention is not limited thereto, and a single-phase circuit comprising two arm series circuits or a circuit comprising more than four arm series circuits may obtain the similar effects. Furthermore, the arm series circuit may have two or more of arm circuits.

We claim:

1. An accident detection circuit of a voltage-type self-excited power converter having an arm series circuit in which a plurality of arm circuits are connected in series, said each arm circuit comprising a power semiconductor element of self turn off type and an anode reactor for suppressing the current rising rate which is connected in series to the anode included in the semiconductor element, which comprises:

voltage direction-detecting means which detects, respectively, that a voltage generated in the anode reactor of said each arm circuit and applied in a direction exceeds a predetermined value when the current flowing in the direction of from the anode to the cathode of every semiconductor element of said each arm circuit increases, arm current direction-detecting means which detects, respectively, that the current flows in the direction of from the anode to the cathode of every semiconductor element of said each arm circuit, delay means which delays, respectively, an output signal of said current direction-detecting means of said each arm circuit by a certain period of time, and output means which designates the output signals as the accident detection signal of said power converter when the output signal of said voltage direction-detecting means and the output signal of said delay means are simultaneously present in every said arm circuit.

2. An accident detection circuit of a voltage-type self-excited power converter having an arm series circuit in which a plurality of arm circuits are connected in series, said each arm circuit comprising a power semiconductor element of self turn off type, a diode connected in anti-parallel to said semiconductor element and an anode reactor for suppressing the current rising rate which is connected in series to the anode included in the semiconductor element, which comprises:

voltage direction-detecting means which is connected, respectively, in parallel to the anode reactor of said each arm circuit, and detects that a voltage generated in said each anode reactor and applied in a direction exceeds a predetermined value when the current flowing in the direction of from the anode to the cathode of said each semiconductor element increases, arm current direction-detecting means which is provided in every said arm circuit and detects that the current flows in the direction of from the anode to the cathode of said each semiconductor element, delay means which is provided for every said arm circuit and delays an output signal of said arm current direction-detecting means by a certain period of time, and output means which is provided for every said arm circuit, and inputs the output signal of said each voltage-direction-detecting means and the output signal of said each delay means, and designates the output signals as the accident detection signal of said power converter when both output signals are simultaneously present.

3. An accident detection circuit of a voltage-type self-excited power converter according to claim 1 or 2, in which said arm series circuits are connected in parallel in plural numbers, and said voltage direction-detecting means, said arm current direction-detecting means and said output means are provided for every arm circuit of one arm series circuit among said arm series circuits.

4. An accident detection circuit of a voltage-type self-excited power converter according to claim 1 or 2, wherein the arm current direction-detecting means comprises a light-emitting element which emits the light when the current flows, a first resistance which is connected in series to said light-emitting element and sets the voltage, a second resistance connected in parallel to said first resistance and said light-emitting element, a light-receiving element for receiving the light from said light-emitting element and converting it to an electric signal, a light guide which guides the light from said light-emitting element to said light-receiving element, and an amplifying circuit which amplifies the electric signal obtained from said light-receiving element.

5. An accident detection circuit of a voltage-type self-excited power converter according to claim 1 or 2, wherein said arm current direction-detecting means comprises a level determination circuit which detects the current flowing to the anode reactor and determines whether said detected current is positive or negative.

6. An accident detection circuit of a voltage-type self-excited power converter having an arm series circuit in which a plurality of arm circuits are connected in series, said each arm circuit comprising a power semiconductor element of self turn off type and an anode reactor for suppressing the current rising rate which is connected in series to the anode included in the semiconductor element, which comprises:

voltage direction-detecting means which detects, respectively, that a voltage generated in the anode reactor of said each arm circuit and applied in a direction exceeds a predetermined value when the current flowing in the direction of from the anode to the cathode of every semiconductor element of said each arm circuit increases, continuity period-control means which controls, respectively, the continuity period of the semiconductor element of said each arm circuit, delay means which delays, respectively, an output signal of said each continuity period-control means by a certain period of time, and output means which designates the output signals as the accident detection signal of said power converter when the output signal of said voltage direction-detecting means and the output signal of said delay means are simultaneously present in every said arm circuit.

7. An accident detection circuit of a voltage-type self-excited power converter having an arm series circuit in which a plurality of arm circuits are connected in series, said each arm circuit comprising a power semiconductor element of self turn off type, a diode connected in anti-parallel to said semiconductor element and an anode reactor for suppressing the current rising rate which is connected in series to the anode included in the semiconductor element, which comprises:

voltage direction-detecting means which is connected, respectively, in parallel to the anode reactor of said each arm circuit, and detects that a voltage generated in the anode reactor of said each arm circuit and applied in a direction exceeds a predetermined value when the current flowing in the direction of from the anode to the cathode of said each semiconductor element increases, continuity period-control means which is provided in said each arm circuit and controls the continuity period of said semiconductor element, delay means which delays the output signal of said continuity period-control means by a certain period of time, and output means which is provided for every said arm circuit, and designates the output signals as the accident detection signal of said power converter when the output signal of said voltage direction-detecting means and the output signal of said delay means are simultaneously present.

8. An accident detection circuit of a voltage-type self-excited power converter according to claim 6 or 7, in which said arm series circuits are connected in plural numbers and in parallel, and said voltage direction-detecting means, said continuity period-control means, said delay means and said output means are provided for every arm circuit of one arm series circuit among said arm series circuits.

9. An accident detection circuit of a voltage-type self-excited power converter having an arm series circuit in which a plurality of arm circuits are connected in series, said each arm circuit comprising a power semiconductor element of self turn off type and an anode reactor for suppressing the current rising rate which is connected in series to the anode included in the semiconductor element, which comprises:

voltage direction-detecting means which detects, respectively, that a voltage generated in the anode reactor of said each arm circuit and applied in a direction exceeds a predetermined value when the current flowing in the direction of from the anode to the cathode of every semiconductor element of said each arm circuit increases, voltage detecting means which detects, respectively, the off-gate voltage between the gate and the cathode of every semiconductor element of said each arm circuit, delay means which inverts and delays by a certain period of time, respectively, the output signal of said each voltage detecting means, and output means which designates the output signals as the accident detection signal of said power converter when the output signal of said voltage direction-detecting means and the output signal of said delay means are simultaneously present in every said arm circuit.

10. An accident detection circuit of a voltage-type self-excited power converter having an arm series circuit in which a plurality of arm circuits are connected in series, said each arm circuit comprising a power semiconductor element of self turn off type, a diode connected in anti-parallel to said semiconductor element and an anode reactor for suppressing the current rising rate which is connected in series to the anode included in the semiconductor element, which comprises:

voltage direction-detecting means which is connected, respectively, in parallel to the anode reactor of said each arm circuit, and detects that a voltage generated in the anode reactor of said each arm circuit exceeds a certain value when the current flowing in the direction of from the anode to the cathode of said each semiconductor element increases, voltage detecting means which is provided for every said arm circuit and detects, respectively, the off-gate voltage between the gate and the cathode of every semiconductor element of said each arm circuit, delay means which is provided for every said arm circuit, and inverts and delays by a certain period of time, respectively, the output signal of said voltage detecting means, and output means which designates the output signals as the accident detection signal of said power converter when the output signal of said voltage direction-detecting means and the output signal of said delay means are simultaneously present in every said arm circuit.

11. An accident detection circuit of a voltage-type self-excited power converter according to claim 9 or 10, in which said arm series circuits are connected in parallel in plural numbers, and said voltage direction-detecting means, said voltage detecting means, said delay means and said output means are provided for every arm circuit of one arm series circuit among said arm series circuits.

12. An accident detection circuit of a voltage-type self-excited power converter having an arm series circuit in which a plurality of arm circuits are connected in series, said each arm circuit comprising a power semiconductor element of self turn off type and an anode reactor for suppressing the current rising rate which is connected in series to the anode included in the semiconductor element, which comprises:

voltage direction-detecting means which detects, respectively, that a voltage generated in the anode reactor of said each arm circuit and applied in a direction exceeds a predetermined value when the current flowing in the direction of from the anode to the cathode of every semiconductor element of said each arm circuit increases, and delay means which delays the output signal of said voltage direction-detecting means, respectively, by a certain period of time, and designates the output signal as the accident detection signal of said power converter.

13. An accident detection circuit of a voltage-type self-excited power converter having an arm series circuit in which a plurality of arm circuits are connected in series, said each arm circuit comprising a power semiconductor element of self turn off type, a diode connected in anti-parallel to said semiconductor element and an anode reactor for suppressing the current rising rate which is connected in series to the anode included in the semiconductor element, which comprises:

anode reactor voltage direction-detecting means which is connected, respectively, in parallel to the anode reactor of said each arm circuit and detects that the voltage in the direction generated in the anode reactor of said each arm circuit exceeds a certain value when the current flowing in the direction of from the anode to the cathode of said each semiconductor element of said each arm circuit increases, and delay means which delays the output signal of said voltage direction-detecting means, respectively, by a certain period of time, and designates the output signal as the accident detection signal of said power converter.

14. An accident detection circuit of a voltage-type self-excited power converter according to claim 12 or 13, in which a plurality of arm series circuits are connected in parallel, and said voltage direction-detecting means and said delay means are provided for every arm circuit of one arm series circuit among said arm series circuits.

15. An accident detection circuit of a voltage-type self-excited power converter according to any one of claims 1, 2, 6, 7, 9, 10, 12 or 13, wherein the voltage direction-detecting means comprises a light-emitting element which emits the light when the current flows, a resistance which is connected in series to said light-emitting element and sets the voltage, a light-receiving element for receiving the light from said light-emitting element and converting it to an electric signal, a light guide which guides the light from said light-emitting element to said light-receiving element, and an amplifying circuit which amplifies the electric signal obtained from said light-receiving element.

* * * * *